United States Patent
Schindler et al.

[11] Patent Number: 6,051,485
[45] Date of Patent: Apr. 18, 2000

[54] METHOD OF PRODUCING A PLATINUM-METAL PATTERN OR STRUCTURE BY A LIFT-OFF PROCESS

[75] Inventors: Günther Schindler; Walter Hartner, both of München; Dana Pitzer, Unterschleissheim, all of Germany

[73] Assignee: Siemens Aktiengesellschaft, Munich, Germany

[21] Appl. No.: 09/066,245

[22] Filed: Apr. 24, 1998

[30] Foreign Application Priority Data

Apr. 24, 1997 [DE] Germany .................... 197 17 363

[51] Int. Cl.⁷ .................................................. H01L 21/28
[52] U.S. Cl. ..................... 438/577; 438/675; 438/574; 438/579
[58] Field of Search ...................... 438/FOR 339, 438/FOR 455, 942, 951, 182, 574–580, 650, 670–675, 686; 257/283

[56] References Cited

U.S. PATENT DOCUMENTS

| | | | |
|---|---|---|---|
| 4,283,483 | 8/1981 | Coane | 430/296 |
| 4,428,796 | 1/1984 | Milgram | 156/637 |
| 4,489,101 | 12/1984 | Shibata | 427/39 |
| 4,497,684 | 2/1985 | Sebesta | 156/643 |
| 4,980,316 | 12/1990 | Huebner | 438/577 |
| 5,053,348 | 10/1991 | Mishra et al. | 438/571 |
| 5,130,764 | 7/1992 | Cetronio et al. | 357/221 |
| 5,155,053 | 10/1992 | Atkinson | 438/577 |
| 5,240,878 | 8/1993 | Fitzsimmons et al. | 438/670 |
| 5,554,488 | 9/1996 | Rioux | 430/315 |
| 5,705,432 | 1/1998 | Lee et al. | 438/606 |

FOREIGN PATENT DOCUMENTS

| | | | |
|---|---|---|---|
| 53-94767 | 8/1978 | Japan | 438/FOR 455 |
| 55-154737 | 2/1980 | Japan | 438/FOR 455 |
| 57-183037 | 11/1982 | Japan | 438/FOR 455 |
| 58-91640 | 5/1983 | Japan | 438/FOR 455 |
| 63-175480 | 7/1988 | Japan | 438/FOR 455 |

*Primary Examiner*—Charles Bowers
*Assistant Examiner*—Thanh Nguyen
*Attorney, Agent, or Firm*—Herbert L. Lerner; Laurence A. Greenberg; Werner H. Stemer

[57] ABSTRACT

A method of producing a platinum-metal structure or pattern on a substrate, which includes the steps of applying a silicon oxide layer to the substrate; applying a mask to the silicon oxide layer which is formed with an opening at a location thereof at which the platinum-metal structure or pattern is to be produced; etching the silicon oxide layer so that the substrate surface area exposed by the opening formed in the mask is larger than the opening in the mask; applying a platinum-metal layer to the mask and the exposed substrate surface area; and removing the silicon oxide layer in an etching process, so that the platinum metal present on the mask is removed simultaneously therewith, and the platinum metal present on the substrate surface forms the platinum-metal pattern or structure.

12 Claims, 2 Drawing Sheets

METHOD OF PRODUCING A PLATINUM-METAL PATTERN OR STRUCTURE BY A LIFT-OFF PROCESS

BACKGROUND OF THE INVENTION

Field of the Invention

The invention relates to a method of producing a platinum-metal structure or pattern by a lift-off process, more particularly, on a substrate and in the course of producing an integrated circuit.

In semiconductor technology, the use of platinum metals as conductive materials is becoming of interest. In this context, "platinum metal" should be understood to be any of the group of platinum metals, namely Pt, Ir, Ru, and so forth. Being precious or noble metals, they have a high conductivity and, even at high temperatures in an oxygen-containing atmosphere, will not form nonconductive oxides. Moreover, they have good interface properties, both in mechanical and in electrical terms, with respect to many substances used in semiconductor technology. An important field of application of platinum metals is the use thereof as an electrode material in storage capacitors in integrated DRAM memories, in particular, if the latter have a so-called high-$\epsilon$ dielectric (for example BST) or a ferroelectric as the storage dielectric. The fabrication of these storage dielectrics requires high temperatures in an oxidizing atmosphere. Such storage cells require little space or have a relatively small footprint and are of great interest for future generations of memories.

A drawback of the platinum metals is that they cannot be etched readily. Methods to date are based predominantly upon physical etching, for example ion milling, and therefore have only limited selectivity with respect to other materials such as photoresist, for example. Lift-off techniques employing a mask of photoresist or titanium have already been used heretofore for very large structures or patterns.

In a lift-off process, as is generally known, a mask is applied to a substrate under the layer to be structured or configured, the mask being formed with an opening at the locations of the pattern or structure to be produced. Only that part of the layer which overlies the mask is then removed together with the mask. In this context, it is important that the mask have a negative side at the edge of the opening, i.e., that the exposed substrate surface area be larger than the mask opening on the upper side of the mask. In other words, the mask must overhang in some form or other. As a result, the side of the mask is not coated, and the solvent for the mask can attack at this location. If photoresist is used as the mask in a liftoff process, these negative sides can be achieved only by special techniques which are unconventional for semiconductor fabrication (for example, by image reversal). If titanium is used as the mask, the time factor plays a vital role, because titanium is readily oxidized at the surface thereof upon contact with air and is then difficult to remove.

SUMMARY OF THE INVENTION

It is accordingly an object of the invention to provide a method of producing a platinum-metal structure or pattern by a lift-off process. Furthermore, it is also an object of the invention to provide such a method that is capable of being integrated into the fabrication process of a DRAM storage cell.

With the foregoing and other objects in view, there is provided, in accordance with the invention, a method of producing a platinum-metal structure or pattern on a substrate, which comprises the steps of:
 a) applying a silicon oxide layer to the substrate;
 b) applying a mask to the silicon oxide layer which is formed with an opening at a location thereof at which the platinum-metal structure or pattern is to be produced;
 c) etching the silicon oxide layer so that the substrate surface area exposed by the opening formed in the mask is larger than the opening in the mask;
 d) applying a platinum-metal layer to the mask and the exposed substrate surface area; and
 e) removing the silicon oxide layer in an etching process, so that the platinum metal present on the mask is removed simultaneously therewith, and the platinum metal present on the substrate surface forms the platinum-metal pattern or structure.

In accordance with another mode of the method according to the invention, step c) includes an anisotropic and a subsequent isotropic etching process.

In accordance with a further mode of the method according to the invention, the mask which is produced is a hard mask.

In accordance with an added mode, the method of the invention includes applying an etch stop layer to the substrate prior to step a), and again removing the etch stop layer within the opening prior to step d).

In accordance with an additional mode, the method according to the invention includes, in step c), exposing the surface of the etch stop layer, and then etching the etch stop layer anisotropically or isotropically.

In accordance with yet another mode, the method according to the invention includes removing the silicon oxide layer with HF in step e).

In accordance with another aspect of the invention, there is provided a method of fabricating a platinum-metal pattern or structure on a substrate, which comprises the steps of:
 a) applying a silicon oxide layer and an overlying silicon layer to the substrate;
 b) applying a photomask to the silicon layer which has an opening formed therein at a location at which the platinum-metal pattern or structure is to be fabricated;
 c) etching the silicon layer and the silicon oxide layer, and oxidizing the exposed surface area of the silicon layer;
 d) applying a platinum-metal layer to the mask surface area and the exposed substrate surface area; and
 e) removing the silicon oxide layer in an etching process, so that platinum metal present on the mask surface area is removed simultaneously with the silicon oxide layer and the platinum metal present on the substrate surface forms the platinum-metal pattern or structure.

In accordance with yet a further mode, the method includes applying an etch stop layer to the substrate prior to step a), and again removing the etch stop layer within the opening prior to step d).

In accordance with yet an added mode, the method includes, in step c), exposing the surface of the etch stop layer, and then etching the etch stop layer anisotropically or isotropically.

In accordance with yet an additional mode, the method includes removing the silicon oxide layer with HF in step e).

In accordance with still another mode, the method according to the invention includes depositing an oxidation protection layer on top of the silicon layer in step a).

In accordance with a concomitant mode, the method according to the invention includes performing steps a) to e) in fabricating a capacitor electrode.

The invention is based on the use of silicon oxide as a constituent of a mask for a lift-off process. In the process, the required negative sidewall of the mask is achieved, according to a first embodiment, via an etching process, in particular via a combination of an anisotropic and an isotropic etching process. According to a second embodiment, a silicon layer is applied to the silicon oxide layer, and after this double layer has been patterned in accordance with the mask to be fabricated, an oxidation of the silicon layer is carried out; the concomitant increase in volume of the silicon layer results in an overhang over the silicon oxide layer. After the coating with the platinum metal the silicon oxide mask can be removed very simply, for example with HF. The process can be integrated without any difficulty into the fabrication process of a DRAM storage cell, in the course of which process an electrode of the storage capacitor is fabricated from a platinum metal.

On top of the substrate to which the mask is applied, an etch stop layer, for example of silicon nitride, can be applied before the silicon oxide layer, to protect the substrate when the mask is removed. The platinum metal used is preferably Pt or Ir.

Other features which are considered as characteristic for the invention are set forth in the appended claims.

Although the invention is illustrated and described herein as embodied in a fabrication method for a platinum-metal pattern by means of a lift-off process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, wherein:

DESCRIPTION OF THE PREFERRED EMBODIMENTS

Figure 1:
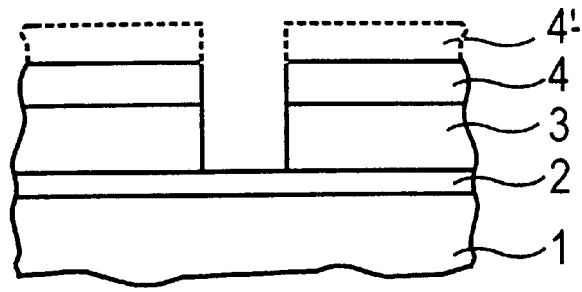
FIGS. 1 to 4 are diagrammatic cross-sectional views of a substrate shown in different developmental phases thereof which serve to illustrate the steps of a first mode of the method of producing a platinum-metal pattern or structure in accordance with the invention.

Referring now to the drawings and, first, particularly to FIG. 1 thereof, there is shown therein a substrate 1, an etch stop layer 2 formed, for example, of nitride, a silicon oxide layer 3 and a mask layer 4 which are applied by heretofore known processed or techniques. The thicknesses of the layers 2 and 3 may be 20 nm and 50 nm, respectively, for example. The substrate may include previously produced circuit elements, for example, an electrical connection for the platinum structure or pattern to be fabricated. The optional etch stop layer is preferably formed of silicon nitride. The mask layer 4 may either be a photoresist layer, which is exposed and developed in accordance with the platinum pattern to be fabricated and consequently is formed with an opening in the region of the platinum pattern to be fabricated. Alternatively, however, the mask layer may be a so-called hard mask which is formed of silicon nitride and is produced with the aid of a suitably structured or configured additional photomask 9' shown in broken lines. The hard mask 4 is used for the further steps, after the resist mask 4' has been removed. One advantage resulting from this variation is that it provides the additional option of hot-sputtering the platinum metal. The mask 4 is used to etch the silicon oxide layer 3. In this specific embodiment, the oxide layer 3 is initially etched anisotropically down to the etch stop layer 2, as shown in FIG. 1.

Figure 2:
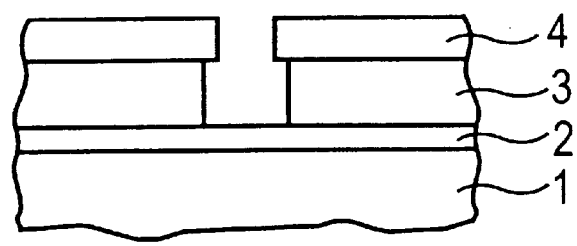

The step of the process shown in FIG. 1 is followed in FIG. 2 by isotropic etching of the silicon oxide layer 3 selectively with respect to the etch stop layer 2, for example, in a wet-etch step. The mask 4 consequently overhangs the edge of the silicon oxide mask 3, the overall pattern or structure thus having a negative side.

Figure 3:
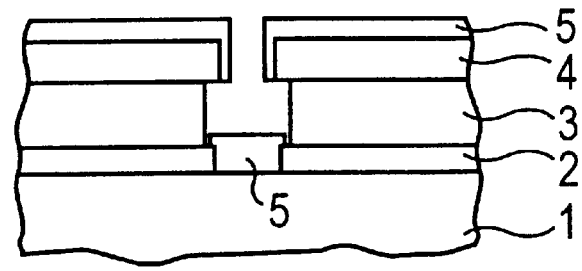

As shown in FIG. 3, the exposed etch stop layer 2 is then removed, so that the substrate 1, if necessary or desirable, with a connection structure or pattern for the platinum structure or pattern, is exposed. This configuration is subjected to a blanket or total-surface deposition of a platinum metal 5, preferably Pt, for example by a sputtering process, wherein the sides of the silicon oxide mask 3 are not coated, so that the solvent in the subsequent silicon oxide wet-etch process is able to attack or aggressively act at these locations, and the platinum overlying the mask surface is removed at the same time.

Figure 4:
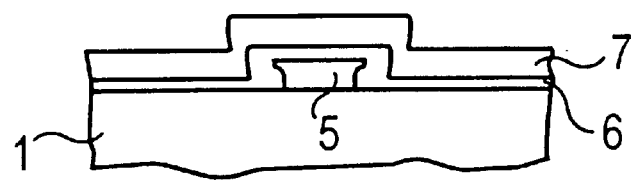

After the silicon oxide etching process has been performed according to FIG. 3, only the platinum forming the platinum pattern remains on the surface of the substrate 1, as shown in FIG. 4. A storage capacitor can be fabricated by the application of a storage dielectric 6, especially a high-$\epsilon$ dielectric or a ferroelectric as noted hereinbefore, and a subsequent production of a second capacitor electrode 7, for example, also formed of platinum.

Figure 5:
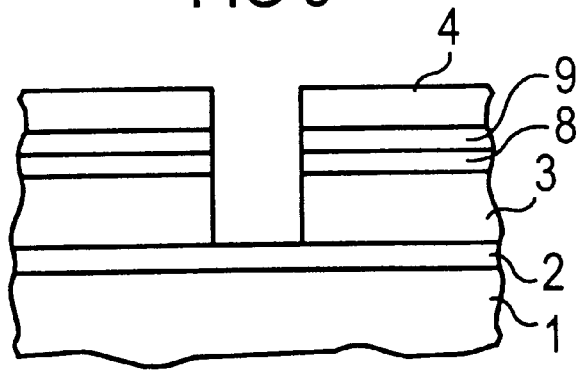
FIGS. 5 to 7 are views similar to those of FIGS. 1 to 4 illustrating different phases of development and thus the essential steps of a second mode of the method of producing a platinum-metal pattern or structure.

In the second specific mode of the process according to the invention, as illustrated in FIG. 5, an etch stop layer 2 is first preferably applied to the substrate 1 as in the first mode of the process. A double layer of silicon oxide 3 and polysilicon 8 is deposited on the etch stop layer 2. Then an oxidation protection layer 9, in particular a nitride layer, can be deposited on the layer 8. The layer sequence 3, 8, 9 is then etched anisotropically down to the etch stop layer 2, as shown in FIG. 5, with the aid of a photomask 4, which is formed with an opening at the location of the platinum pattern to be produced. The photoresist mask 4 can then be removed.

Figure 6:
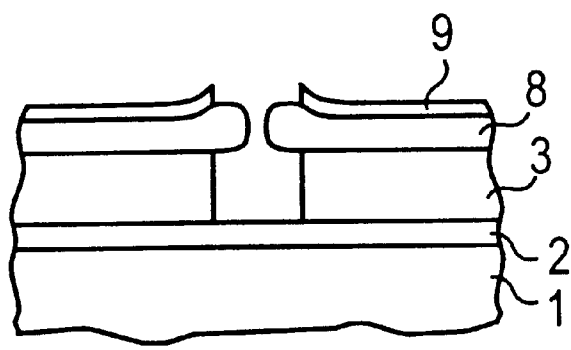
Figure 7:
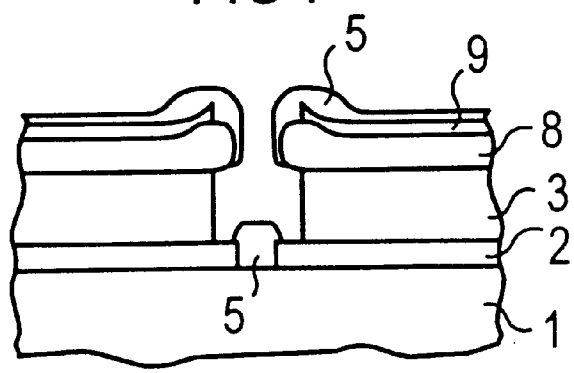

As shown in FIG. 6, a thermal oxidation step is performed which, at the exposed locations, converts the polysilicon into silicon oxide, which results in a volume increase. The opening in the polysilicon layer 8 is consequentially reduced, resulting in an overhang over the silicon oxide pattern. The mask for the lift-off process in this case therefore includes the silicon oxide layer 3 and the polysilicon layer 8 (and, if necessary or desirable, the nitride layer 9). The optional oxidation protection layer or nitride layer 9 effects a more pronounced overhang, because the polysilicon 8 can then oxidize only at the exposed edges. With this illustrative embodiment, the layout must, in any case, take into account the fact that, due to the oxidation, the opening will be reduced in size compared with that of the original resist mask 4.

The further steps of the process illustrated in FIG. 6 can be performed as in the first illustrative mode of the process according to the invention, i.e., the etch stop layer 2 is removed, a platinum metal is then applied, and the platinum metal overlying the mask surface is removed together with the mask. As described hereinabove, a capacitor can then be completed therewith.

We claim:

1. A method of producing a platinum-metal structure or pattern on a substrate, which comprises the steps of:
   a) applying an etch stop layer to the substrate;
   b) applying a silicon oxide layer to the substrate;
   c) applying a mask to the silicon oxide layer which is formed with an opening at a location thereof at which the platinum-metal structure or pattern is to be produced;
   d) etching the silicon oxide layer so that the substrate surface area exposed by the opening formed in the mask is larger than the opening in the mask;
   e) removing the etch stop layer within the opening;
   f) applying a platinum-metal layer to the mask and the exposed substrate surface area; and
   g) removing the silicon oxide layer in an etching process, so that the platinum metal present on the mask is removed simultaneously therewith, and the platinum metal present on the substrate surface forms the platinum-metal pattern or structure.

2. The method according to claim 1, wherein step d) includes an anisotropic and a subsequent isotropic etching process.

3. The method according to claim 1, wherein the mask which is produced is a hard mask.

4. The method according to claim 1, which includes, in step d), exposing the surface of the etch stop layer, and then etching the etch stop layer anisotropically or isotropically.

5. The method according to claim 1, removing the silicon oxide layer with HF in step g).

6. A method of fabricating a platinum-metal pattern or structure on a substrate, which comprises the steps of:
   a) applying a silicon oxide layer and an overlying silicon layer to the substrate;
   b) applying a photomask to the silicon layer which has an opening formed therein at a location at which the platinum-metal pattern or structure is to be fabricated;
   c) etching the silicon layer and the silicon oxide layer, and oxidizing the exposed surface area of the silicon layer;
   d) applying a platinum-metal layer to the mask surface area and the exposed substrate surface area; and
   e) removing the silicon oxide layer in an etching process, so that platinum metal present on the mask surface area is removed simultaneously with the silicon oxide layer and the platinum metal present on the substrate surface forms the platinum-metal pattern or structure.

7. The method according to claim 6, which includes applying an etch stop layer to the substrate prior to step a), and again removing the etch stop layer within the opening prior to step d).

8. The method according to claim 7, which includes, in step c), exposing the surface of the etch stop layer, and then etching the etch stop layer anisotropically or isotropically.

9. The method according to claim 6, which includes removing the silicon oxide layer with HF in step e).

10. The method according to claim 6, which includes depositing an oxidation protection layer on top of the silicon layer in step a).

11. The method according to claim 1, which includes performing steps a) to e) in fabricating a capacitor electrode.

12. The method according to claim 6, which includes performing steps a) to e) in fabricating a capacitor electrode.

* * * * *